United States Patent
Heinisch

(10) Patent No.: US 10,994,678 B2
(45) Date of Patent: May 4, 2021

(54) METHOD AND SYSTEM FOR THE AUTOMATED TESTING OF ELECTRICAL CABIN LOADS IN A CABIN OF AN AIRCRAFT

(71) Applicant: Airbus Operations GmbH, Hamburg (DE)

(72) Inventor: Matthias Heinisch, Hamburg (DE)

(73) Assignee: AIRBUS OPERATIONS GMBH, Hamburg (DE)

( * ) Notice: Subject to any disclaimer, the term of this patent is extended or adjusted under 35 U.S.C. 154(b) by 30 days.

(21) Appl. No.: 16/417,017

(22) Filed: May 20, 2019

(65) Prior Publication Data

US 2019/0366955 A1    Dec. 5, 2019

(30) Foreign Application Priority Data

May 30, 2018   (DE) .......................... 102018208606.0

(51) Int. Cl.
   *B60R 16/03*        (2006.01)
   *B64F 5/60*         (2017.01)

(52) U.S. Cl.
   CPC ............... *B60R 16/03* (2013.01); *B64F 5/60* (2017.01); *B64D 2221/00* (2013.01)

(58) Field of Classification Search
   CPC ..... B64F 5/60; G64D 2221/00; G01R 31/008; G60R 16/03
   See application file for complete search history.

(56) References Cited

U.S. PATENT DOCUMENTS

| | | | |
|---|---|---|---|
| 5,754,445 A * | 5/1998 | Jouper ...................... | H02J 3/14 700/295 |
| 6,921,987 B2 * | 7/2005 | Marin-Martinod ....... | H02J 1/14 307/32 |
| 7,130,724 B2 | 10/2006 | Petersen et al. | |
| 7,805,204 B2 | 9/2010 | Ghanekar et al. | |

(Continued)

FOREIGN PATENT DOCUMENTS

EP    1973018 B1    9/2008

OTHER PUBLICATIONS

French Search Report for corresponding French Patent Application No. 1905473 dated Sep. 29, 2020.

*Primary Examiner* — Thomas J. Hiltunen
(74) *Attorney, Agent, or Firm* — Greer, Burns & Crain, Ltd.

(57) ABSTRACT

A method for the automated testing of electrical cabin loads in a cabin of an aircraft comprises activating at least one electrical cabin load in a predetermined operating mode via a test controller; recording an electric power consumption profile of the at least one electrical cabin load in the activated operating mode via a power controller of an electric power distribution system of the cabin of the aircraft, wherein the power controller regulates electric power consumption of the at least one electrical cabin load within the power distribution system; transmitting the recorded power consumption profile to the test controller; and comparing the recorded power consumption profile with a reference profile for the activated operating mode of the at least one cabin load via the test controller, in order to test the at least one electrical cabin load for operability.

7 Claims, 1 Drawing Sheet

(56) References Cited

U.S. PATENT DOCUMENTS

| | | | | |
|---|---|---|---|---|
| 8,209,101 | B2* | 6/2012 | Breit | H02J 3/14 |
| | | | | 701/80 |
| 8,504,217 | B2* | 8/2013 | Nilsen | G06F 1/324 |
| | | | | 700/295 |
| 9,438,043 | B2* | 9/2016 | Jouper | H02J 3/005 |
| 9,514,020 | B2* | 12/2016 | Tonry | G06F 11/321 |
| 9,709,625 | B2* | 7/2017 | Eckert | G01R 31/2851 |
| 2014/0084951 | A1 | 3/2014 | Everth et al. | |
| 2019/0369696 | A1* | 12/2019 | Heilper | G06F 1/3296 |

\* cited by examiner

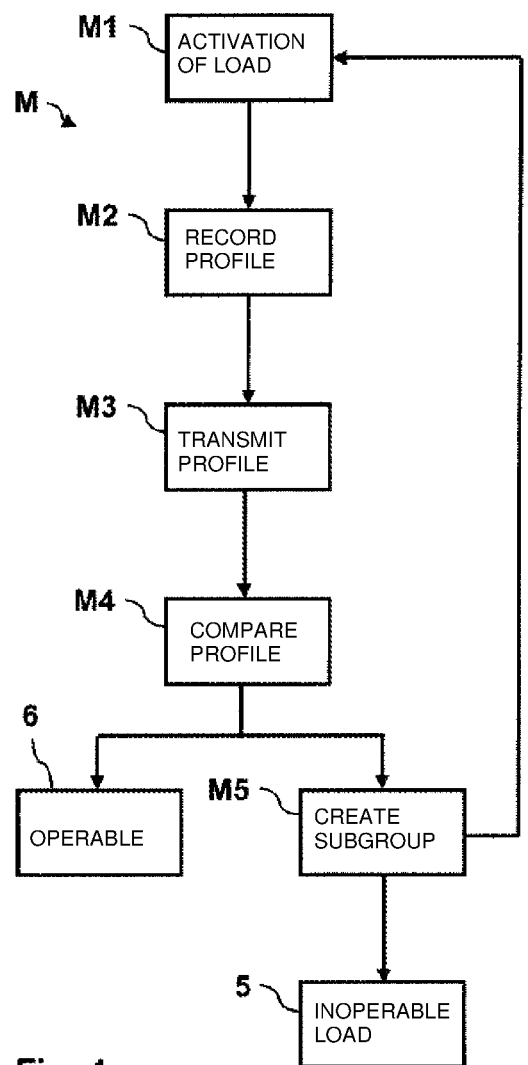
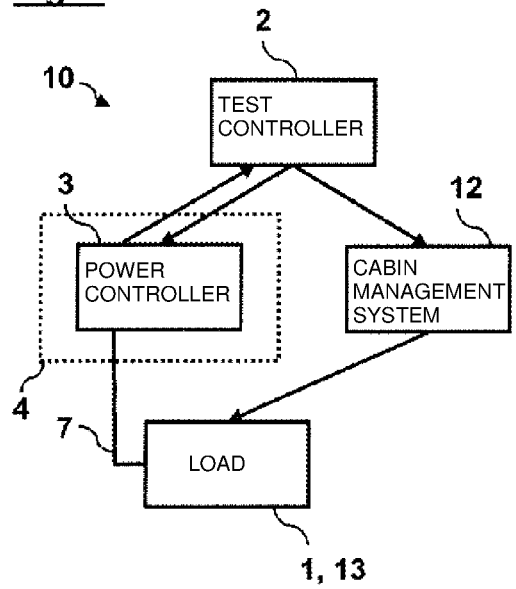
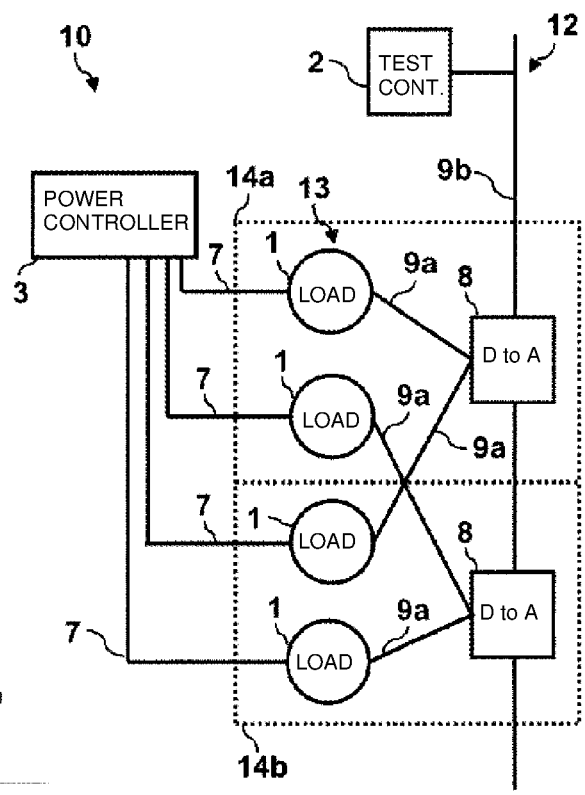
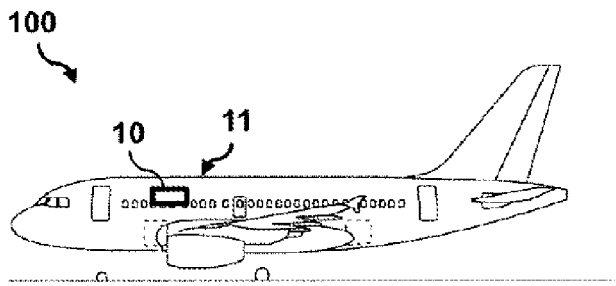

METHOD AND SYSTEM FOR THE AUTOMATED TESTING OF ELECTRICAL CABIN LOADS IN A CABIN OF AN AIRCRAFT

CROSS-REFERENCES TO RELATED APPLICATIONS

This application claims the benefit of the German patent application No. 10 2018 208 606.0 filed on May 30, 2018, the entire disclosures of which are incorporated herein by way of reference.

FIELD OF THE INVENTION

The present invention relates to a method and a system for the automated testing of electrical cabin loads in a cabin of an aircraft.

BACKGROUND OF THE INVENTION

Aircraft cabins, in particular passenger cabins of passenger aircraft, normally comprise a digital cabin management system (CMS) which controls the electrical equipment located in the cabin and the functions thereof, and which regulates the input and output of certain cabin parameters to the passengers and the crew. Functions which are performed may comprise, inter alia, cabin illumination, cabin communication, for example, cockpit/cabin announcements, an entertainment system, visual and/or acoustic signals, for example, emergency signals, non-smoking/fasten seat belt signs, door latch indications, etc., a cabin monitoring system or cabin sensors such as temperature sensors, smoke detectors, or cameras and various other cabin functions which may also have safety-related significance in some cases. For this purpose, a typical cabin management system comprises, inter alia, a main computer, several flight attendant panels, and a data network for data transmission in the cabin.

Here, the electrical equipment in the cabin is typically supplied with electric power by an electric power distribution system (EPDS); see, for example, the publication EP 1 973 018 B1. For this purpose, such a power distribution system may contain one or a plurality of power controllers and/or power distribution boxes (PDBs), which regulate electric power consumption of the cabin's electrical loads within the power distribution system. The EPDS may, for example, be designed to continuously monitor the power supply of the cabin electronics. For this purpose, the EPDS may be connected to the cabin management system via a data network within the cabin. The cabin management system may, in turn, comprise electronic switching units for (de)activating the individual cabin loads or groups of cabin loads.

As part of test automation of the electronic components of a cabin, i.e., the automated testing of cabin hardware, it is sometimes proposed to equip the cabin with suitable sensors and the like, which are intended to test the operability of individual cabin components. For example, the operability of an illumination system may be tested by installing a plurality of light sensors in the cabin, such as brightness and/or ambient light sensors, cameras or the like. Since additional cables, data lines, etc., are also to be laid in addition to these sensors, this approach results in a certain amount of installation effort and cost.

Against this background, an object of the present invention is to find solutions for the automated testing of electrical cabin equipment which are as simple as possible.

SUMMARY OF THE INVENTION

Accordingly, a method is provided for the automated testing of electrical cabin loads in a cabin of an aircraft. The method comprises activating at least one electrical cabin load in a predetermined operating mode via a test controller; recording an electric power consumption profile of the at least one electrical cabin load in the activated operating mode via a power controller of an electric power distribution system of the cabin of the aircraft, wherein the power controller regulates electric power consumption of the at least one electrical cabin load within the power distribution system; transmitting the recorded power consumption profile to the test controller; and comparing the recorded power consumption profile with a reference profile for the activated operating mode of the at least one cabin load via the test controller, in order to test the at least one electrical cabin load for operability.

Furthermore, a system is provided for the automated testing of electrical cabin loads in a cabin of an aircraft. The system comprises at least one electrical cabin load; an electric power distribution system for supplying the at least one electrical cabin load with electric power, wherein the power distribution system comprises a power controller which is designed to regulate electric power consumption of the at least one electrical cabin load within the power distribution system and to record an electric power consumption profile of the at least one electrical cabin load; and a test controller which is communicatively connected to the power controller and is designed to activate the at least one electrical cabin load in a predetermined operating mode and to compare a power consumption profile of the at least one electrical cabin load in the activated operating mode with a reference profile for the activated operating mode, said profile being recorded by the power controller and transmitted to the test controller, in order to test the at least one electrical cabin load for operability.

Furthermore, an aircraft is provided comprising a system according to the present invention.

One idea underlying the present invention is to use a power controller of a power distribution system which is already available in the cabin in any case for the automated testing of electrical cabin equipment. For this purpose, the present invention follows the approach of effectively using the power consumption or the profile of the power consumption of individual cabin loads or groups of cabin loads as a sensor. For this purpose, a power consumption profile is recorded and compared with predetermined, expected reference profiles. If the recorded power consumption profile matches the corresponding reference profile to a sufficient extent, the tested cabin load or the group of cabin loads is generally considered to be operable. However, if the recorded power consumption profile differs from the reference profile to a significant extent, insufficient operability of the cabin load(s) results. As a consequence, additional sensor systems for the automated testing and the cabling required therefor may be dispensed with. The present system is thus considerably simpler and is therefore ultimately more robust with respect to possible trouble sources, for example, defective and/or missing sensors, defective and/or inaccurately calibrated or configured sensors, etc. Rather, a pragmatic test method or test system is provided, with the aid of which a cabin status is achievable without extensive and costly tests.

For example, an illumination system may be tested, for example, by activating individual or multiple lighting fittings or lamps of the illumination system and evaluating their power consumption. If this results in a relevant deviation of the actual power consumption from an expected profile in the case of full operability, it may be concluded that the operability of the illumination system or of subcomponents of the system is insufficient.

On the one hand, the method according to the present invention may run completely within a cabin of an aircraft. For this purpose, in particular, the test controller may, for example, be provided in the cabin. However, on the other hand, the method may likewise, for example, effectively be carried out via remote diagnosis by testing personnel situated outside the cabin of the aircraft. For this purpose, for example, the cabin loads and the power controller may be accessed by a test controller from outside the cabin.

Advantageous embodiments and refinements result from the description with reference to the figures.

According to one refinement, a plurality of electrical cabin loads may be tested jointly as a load group. In this refinement, in contrast to an individual test of an individual cabin load, a combined power consumption profile of a group made up of a plurality of loads is thus tested. Here, the combined power consumption profile is correspondingly compared with an expected or predetermined reference profile for the group. In this way, results about the basic status of a group of loads may be quickly and simply obtained, without having to check the cabin loads individually in a laborious manner.

According to one refinement, a reference profile for the activated operating mode of the load group may be determined from reference profiles for operating modes of the individual electrical cabin loads. For example, a load group may be made up of several cabin loads which are respectively operated in a particular operating mode. The common operating mode of the cabin loads within the load group may now be defined as a combination of the operation of the individual cabin loads. If the reference profiles of the individual operating modes of the cabin loads is known, the reference profile of the joint operation may possibly be calculated therefrom. For example, a load group may be made up of four identical cabin loads, wherein the power consumption profile of the load group may result via simple summation of the individual power consumption profiles of the cabin loads.

According to one refinement, the method may furthermore comprise individual testing of a subgroup of the electrical cabin loads of the load group for operability, if insufficient operability of the load group results. If insufficient operability is thus determined when testing the load group, different subgroups of the load group or subsets of the cabin loads may be consecutively tested for operability.

According to one refinement, the individual testing may be iterated until at least one inoperable cabin load is identified. As soon as a fault or insufficient operability is determined in a load group, ever-smaller groups of cabin loads may thus be iteratively tested until a single remaining cabin load or a group of remaining cabin loads is identified as being inoperable.

According to one refinement, a plurality of electrical cabin loads may be divided into at least two load zones. The electrical cabin loads may be tested jointly in one of the load zones, while the power controller deactivates the power supply of the electrical cabin loads in the further load zone. This refinement may, in particular, be used to locate incorrect cabling or connections of individual cabin loads. In one example, the system comprises a total of four identical electrical cabin loads which are respectively divided in pairs into two different load zones, for example, two different cabin areas, for example, a front area and a rear area. Suppose that all four cabin loads are fully operable, wherein, however, the connection of one of the cabin loads from each load zone was transposed with a cabin load from the other load zone; for example, a cabin load from the front area is incorrectly connected in the rear area and conversely, one of the cabin loads in the rear area is connected to the front area. A joint test of all four cabin loads would then reveal only that the group is fully operable. However, if the power supply of the cabin loads in one of the two load zones, for example, in the rear area, is deactivated, a test of the cabin loads of the other load zone, i.e., the front area in the above example, reveals that this group of cabin loads is not operable. In fact, one of these two cabin loads receives no electric power due to the incorrect connection (it is connected to the electrically deactivated load zone; in the example, this is the rear area), so that the power consumption profile does not correspond to the expected reference profile of two fully operable cabin loads.

According to one refinement, the at least one electrical cabin load may be tested for several different operating modes having correspondingly associated reference profiles. For example, different functionalities of cabin loads or groups of cabin loads may be tested in such a way. In one specific example, an illumination system made up of several lighting fittings or lamps may be tested, wherein different illumination conditions are checked, for example, with respect to color, brightness, lighting states, etc.

According to one refinement, the at least one electrical cabin load may be a component of a cabin illumination system, a communication system, an entertainment system, a cabin sensor system, a sanitation facility, a service system and/or a seat system.

The embodiments and refinements mentioned above may be combined in any arbitrary manner, as appropriate. Further possible embodiments, refinements, and implementations of the present invention also include combinations, which are not explicitly mentioned, of features of the present invention which have been previously described or which are described below with respect to the exemplary embodiments. In particular, those skilled in the art will also add individual aspects as improvements or refinements to the respective basic form of the present invention.

BRIEF DESCRIPTION OF THE DRAWINGS

The present invention will be described in greater detail below, based on the exemplary embodiments specified in the schematic figures. The following are shown:

FIG. 1 shows a schematic view of a system for the automated testing of electrical cabin loads in a cabin of an aircraft, according to one embodiment of the present invention;

FIG. 2 shows a schematic flow chart of a method for the system from FIG. 1;

FIG. 3 shows a schematic view of a system according to a further embodiment of the present invention; and FIG. 4 shows a schematic side view of an aircraft with the system from FIG. 1 or 3.

The attached figures are intended to convey additional understanding of the embodiments of the present invention. They illustrate embodiments and are used in conjunction with the description for explaining principles and concepts of the present invention. Other embodiments and many of the aforementioned advantages result with respect to the drawings. The elements of the drawings are not necessarily true to scale with respect to one other.

In the figures of the drawing, identical, functionally identical and identically acting elements, features and components are respectively provided with the same reference characters, unless stated otherwise.

DETAILED DESCRIPTION OF THE PREFERRED EMBODIMENTS

FIG. 1 shows a schematic view of a system 10 for the automated testing of electrical cabin loads 1 in a cabin 11 of an aircraft 100, according to one embodiment of the present invention. Such an aircraft 100 may, for example, be a passenger aircraft, as depicted by way of example in FIG. 4.

The system 10 comprises an electrical cabin load 1 or a load group 13 made up of several electrical cabin loads 1. The system 10 furthermore comprises an electric power distribution system 4 for supplying electric power to the at least one electrical cabin load 1. The power distribution system 4 includes a power controller 3 which is designed to regulate electric power consumption of the at least one electrical cabin load 1 within the power distribution system 4. For this purpose, the power controller 3 is electrically connected to the at least one cabin load 1 via one or several power lines 7. For example, the power controller 3 may be a power distribution box (PDB) of an EPDS. Furthermore, the cabin 11 comprises a cabin management system 12 (CMS) which is designed to activate the at least one electrical cabin load 1. For this purpose, the CMS 12 may contain solid-state power controllers (SSPCs) or other electronic switching elements (not depicted), via which individual cabin loads 1 or groups of cabin loads 1 are (de) activatable.

Furthermore, the system 10 comprises a test controller 2 which, on the one hand, is communicatively connected to the power controller 3, and on the other hand, is linked to the CMS 12 (see arrows in FIG. 1). The test controller 2 is designed to activate the at least one electrical cabin load 1 via the CMS 12 in a predetermined operating mode. The power controller 3 is furthermore designed to record an electric power consumption profile of the at least one electrical cabin load 1 and to transmit it to the test controller 2. The test controller 2 is equipped to compare the transmitted power consumption profile with a predetermined reference profile for the activated operating mode, in order to test the at least one electrical cabin load 1 for operability. In the case that a load group 13 is tested, the corresponding reference profile for the activated operating mode of the load group 13 may be determined from reference profiles for operating modes of the individual electrical cabin loads 1. Further, it is provided that the at least one electrical cabin load 1 is tested for several different operating modes having corresponding associated reference profiles.

The associated test method M is schematically depicted in FIG. 2. In M1, the method M comprises activation of the at least one electrical cabin load 1 in a predetermined operating mode via the test controller 2. In M2, the method M furthermore comprises recording the electric power consumption profile of the at least one electrical cabin load 1 in the activated operating mode via the power controller 3 of the electric power distribution system 4. In M3, the method M furthermore comprises transmission of the recorded power consumption profile to the test controller 2, and in M4, comparison of the detected power consumption profile with the reference profile for the activated operating mode of the at least one electrical cabin load 1 via the test controller 2, in order to test the at least one electrical cabin load 1 for operability.

If the recorded power consumption profile matches the reference profile, the electrical cabin load 1 or the load group 13 is classified as being operable (reference character 6 in FIG. 2). It is thus possible to draw a conclusion very quickly as to the general operability of a group of cabin loads 1, without the need for additional sensors having corresponding cabling. The power consumption profile of the load group 13 or the electrical cabin loads 1 is used here effectively as a "footprint" of the components.

However, if the power consumption profile does not correspond sufficiently to the reference profile, the load group 13 or the at least one electrical cabin load 1 is initially classified as being basically inoperable. In this case, in M5, the method M may subsequently be continued with individual testing of a subgroup of the electrical cabin loads 1 of the load group 13 for operability, if insufficient operability of the load group 13 results. This process may be iterated (see arrow in FIG. 2 between M5 and M1) until at least one inoperable cabin load 5 is identified. Thus, in addition to implementing a practical test of the operability, the depicted method M or the system 10 can also be used to localize faulty components.

A particular difficulty may arise if individual or several cabin loads 1 within the cabin 11 are incorrectly connected and/or wired. For this purpose, FIG. 3 shows a system 10 according to another embodiment of the present invention which is basically configured like the one in FIGS. 1 and 2. However, in this variant, four identical electrical cabin loads 1 are explicitly provided by way of example, which are respectively individually supplied with electric power by the power controller 3. The electrical cabin loads 1 may, for example, be loudspeakers which are connected via analogue data lines 9a to digital-analogue converters 8 which in turn are connected to a digital data line 9b, for example, a data bus, of a CMS 12. Two of the electrical cabin loads 1 are located in a first load zone 14a, for example, a front area of the cabin 11. The other two electrical cabin loads 1 are located in a second load zone 14b, for example, a rear area of the cabin 11. However, in the exemplary embodiment in FIG. 3, the two middle cabin loads 1 are incorrectly wired to the CMS 12, so that both are located in incorrect load zones 14a, 14b with respect to their connection to the CMS 12 (see the course of the lines 9a of the two middle cabin loads 1). Suppose that all four cabin loads 1 are fully operable. In this case, joint testing of all four cabin loads 1 would correspondingly result in a positive result, since their power consumption profile would show no deviations from the expected reference profile. However, activation of the cabin loads 1 via the CMS 12 during operation would have undesirable consequences due to the incorrect wiring. For example, if it were to be attempted to activate the loudspeakers in the front area of the cabin 11 via the CMS 12, i.e., the two upper cabin loads 1 in FIG. 3, only one of the two loudspeakers in the front area would be activated due to the faulty wiring. Instead, a loudspeaker in the rear area would also be activated.

This problem can be solved by jointly testing the electrical cabin loads 1 in one of the load zones 14a, 14b, for example, the upper load zone 14a, i.e., the front area, while the power controller 3 deactivates the power supply of the electrical cabin loads 1 in the further load zone 14b, i.e., the rear area. In this case, recording and comparing the power consumption profile of the cabin loads 1 in the upper load zone 14a reveals that one of the two cabin loads 1 is inoperable (i.e., the lower of the two). In this respect, by deactivating different load zones 14a, 14b, it may be checked whether faulty connections possibly exist within the system 10, i.e., individual cabin loads 1 were erroneously associated with incorrect load zones 14a, 14b due to incorrect wiring.

In the preceding detailed description, various features were combined in one or several examples in order to improve the rigor of the depiction. However, it should be clear that the above description is merely illustrative, but is under no circumstances restrictive. It serves to cover all alternatives, modifications and equivalents of the various features and exemplary embodiments. Given the above description, many other examples will be immediately and directly clear to those skilled in the art, due to their specialized knowledge.

The exemplary embodiments were selected and described in order to be able to depict the principles underlying the present invention and their potential practical applications in the best possible manner. As a result, specialists will be able to modify and use the present invention and its various exemplary embodiments in an optimal manner with respect to the intended application. In the claims and the description, the terms "containing" and "having" are used as linguistically neutral concepts for the corresponding terms "comprising". Furthermore, use of the terms "a", "an" and "one" is not to fundamentally exclude a plurality of features and components described in such a way.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

LIST OF REFERENCE CHARACTERS

1 Cabin load
2 Test controller
3 Power controller
4 Power distribution system
5 Inoperable cabin loads
6 Operable cabin loads/load group
7 Power line
8 Digital-analogue converter
9a Analogue data line
9b Digital data line
10 System
11 Cabin
12 Cabin management system
13 Load group
14a, 14b Load zone
100 Aircraft
M Method
M1 Method step
M2 Method step
M3 Method step
M4 Method step
M5 Method step

The invention claimed is:

1. A method for an automated testing of electrical cabin loads in a cabin of an aircraft, comprising:
activating at least one electrical cabin load in a predetermined operating mode via a test controller;
recording an electric power consumption profile of the at least one electrical cabin load in the activated operating mode via a power controller of an electric power distribution system of the cabin of the aircraft, wherein the power controller regulates electric power consumption of the at least one electrical cabin load within the power distribution system;
transmitting the recorded power consumption profile to the test controller;
comparing the recorded power consumption profile with a reference profile for the activated operating mode of the at least one electrical cabin load via the test controller, to test the at least one electrical cabin load for operability,
wherein a plurality of electrical cabin loads is tested jointly as a load group, and
testing a subgroup of the electrical cabin loads of the load group individually for operability, if insufficient operability of the load group results.

2. The method according to claim 1, wherein a reference profile for the activated operating mode of the load group is determined from reference profiles for operating modes of individual electrical cabin loads.

3. The method according to claim 1, wherein the individual testing is iterated until at least one inoperable cabin load is identified.

4. The method according to claim 1, wherein a plurality of electrical cabin loads is divided into at least two load zones, wherein the electrical cabin loads are tested jointly in one of the load zones, while the power controller deactivates a power supply of the electrical cabin loads in the other load zone.

5. The method according to claim 1, wherein the at least one electrical cabin load is tested for several different operating modes having corresponding associated reference profiles.

6. The method according to claim 1, wherein the at least one electrical cabin load comprises a component from a group including a cabin illumination system, a communication system, an entertainment system, a cabin sensor system, a sanitation facility, a service system and a seat system.

7. A system for automated testing of electrical cabin loads in a cabin of an aircraft, comprising:
a plurality of electrical cabin loads;
an electric power distribution system for supplying the electrical cabin loads with electric power, wherein the power distribution system comprises:
a power controller configured to regulate electric power consumption of the electrical cabin loads within the power distribution system and to record an electric power consumption profile of the electrical cabin loads; and
a test controller communicatively connected to the power controller and configured to activate the electrical cabin loads in a predetermined operating mode and to compare a power consumption profile of the electrical cabin loads in the activated operating mode with a reference profile for the activated operating mode jointly as a group, said power consumption profile being recorded by the power controller and transmitted to the test controller, to test the electrical cabin loads for operability, the test controller further being configured to activate and test a subgroup of the electrical cabin loads of the load group individually for operability, if insufficient operability of the load group results.

\* \* \* \* \*